US011764540B2

(12) United States Patent
Costi et al.

(10) Patent No.: US 11,764,540 B2
(45) Date of Patent: Sep. 19, 2023

(54) METHOD AND APPARATUS FOR MOUNTING AND COOLING A CIRCUIT COMPONENT

(71) Applicant: LANDA LABS (2012) LTD., Rehovot (IL)

(72) Inventors: Ronny Costi, Gedera (IL); Gilad Reut Gelbart, Kibbutz Mefalsim (IL)

(73) Assignee: Landa Labs (2012) LTD., Rehovot (IL)

( * ) Notice: Subject to any disclaimer, the term of this patent is extended or adjusted under 35 U.S.C. 154(b) by 0 days.

(21) Appl. No.: 17/620,729

(22) PCT Filed: Jun. 30, 2020

(86) PCT No.: PCT/IB2020/056184
§ 371 (c)(1),
(2) Date: Dec. 19, 2021

(87) PCT Pub. No.: WO2021/001757
PCT Pub. Date: Jan. 7, 2021

(65) Prior Publication Data
US 2022/0329040 A1 Oct. 13, 2022

(30) Foreign Application Priority Data

Jul. 3, 2019 (GB) ..................................... 1909557

(51) Int. Cl.
*H01S 5/02315* (2021.01)
*H01S 5/0237* (2021.01)
(Continued)

(52) U.S. Cl.
CPC ........ *H01S 5/02315* (2021.01); *H01S 5/0216* (2013.01); *H01S 5/0237* (2021.01);
(Continued)

(58) Field of Classification Search
CPC ............... H01S 5/02315; H01S 5/0216; H01S 5/02345; H01S 5/0237; H01S 5/02469;
(Continued)

(56) References Cited

U.S. PATENT DOCUMENTS

2002/0034066 A1 3/2002 Huang et al.
2004/0190251 A1 9/2004 Prasher et al.
(Continued)

FOREIGN PATENT DOCUMENTS

DE 102013226972 A1 7/2015
EP 1207727 A2 5/2002
(Continued)

*Primary Examiner* — Edward Chin
(74) *Attorney, Agent, or Firm* — Shalom Wertsberger; Saltamar Innovations (57) ABSTRACT

A method is disclosed for mounting and cooling a circuit component having a plurality of contacts. The method comprises mounting the circuit component on a rigid substrate of a thermally conductive material having and electrically insulating regions with a circuit board arranged between the circuit component and the substrate. The circuit board, which carries conductive traces that terminate in contact pads, is secured to the substrate with at least some of the contact pads on the circuit board disposed on the side of the board facing the substrate, some of which being bonded to the substrate. To establish both an electrical and a thermal connection between the contacts of the circuit component and the contact pads bonded to the substrate, blind holes are formed in the base of the circuit board, each hole terminating at a respective one of the contact pads bonded to the substrate.

14 Claims, 2 Drawing Sheets

(51) Int. Cl.
*H01S 5/02345* (2021.01)
*H01S 5/02* (2006.01)
*H01S 5/024* (2006.01)
*H05K 1/02* (2006.01)
*H05K 1/11* (2006.01)
*H05K 3/42* (2006.01)

(52) U.S. Cl.
CPC ...... *H01S 5/02345* (2021.01); *H01S 5/02469* (2013.01); *H01S 5/02476* (2013.01); *H05K 1/0206* (2013.01); *H05K 1/0209* (2013.01); *H05K 1/113* (2013.01); *H05K 1/118* (2013.01); *H05K 3/422* (2013.01); *H05K 2201/09445* (2013.01); *H05K 2201/09509* (2013.01); *H05K 2203/073* (2013.01)

(58) Field of Classification Search
CPC ............. H01S 5/02476; H05K 1/0206; H05K 1/0209; H05K 1/113; H05K 1/118; H05K 3/422; H05K 2201/09445; H05K 2201/09509; H05K 2203/073; H01L 23/3677; H01L 21/486; H01L 23/49827; H01L 23/49833; H01L 23/5384; H01L 23/5385; H01L 23/5387; H01L 23/4985; H01L 24/16; H01L 24/17; H01L 24/81; H01L 2224/13109; H01L 2224/13111; H01L 2224/13139; H01L 2224/13144; H01L 2224/16235; H01L 2224/17519; H01L 2224/81191; H01L 21/4882; H01L 23/367; H01L 23/34

See application file for complete search history.

(56) References Cited

U.S. PATENT DOCUMENTS

| | | |
|---|---|---|
| 2006/0109632 A1 | 5/2006 | Berlin et al. |
| 2013/0215586 A1 | 8/2013 | Furusawa et al. |
| 2013/0228932 A1 | 9/2013 | Yu et al. |
| 2015/0340330 A1 | 11/2015 | Pan et al. |
| 2017/0316881 A1 | 11/2017 | Bachman et al. |
| 2019/0267307 A1* | 8/2019 | Lin .................. H01L 23/3737 |

FOREIGN PATENT DOCUMENTS

| | | |
|---|---|---|
| EP | 3373331 A1 | 9/2018 |
| JP | 3161788 U | 8/2010 |

* cited by examiner

METHOD AND APPARATUS FOR MOUNTING AND COOLING A CIRCUIT COMPONENT

CROSS-REFERENCE TO RELATED APPLICATIONS

This application is the U.S. national stage of International Patent Application No. PCT/IB2020/056184, filed on Jun. 30, 2020, which claims the benefit of United Kingdom Patent Application No. GB 1909557.9, filed on Jul. 3, 2019, the contents of which are incorporated by reference herein in their entirety as if fully set forth herein.

FIELD

The invention relates to a method and an apparatus for mounting and cooling a circuit component.

BACKGROUND

Certain circuit components require several electrical connections and generate considerable heat during operation. To prevent overheating and/or allow efficient operation, such components need to be mounted in good thermal contact with a heat sink, to avoid them being damaged or becoming dysfunctional. They therefore require a mount that provides good heat rejection at the same time as achieving the electrical connections to the contacts of the components. While the invention will be described below by specific reference to vertical-cavity surface-emitting laser VCSEL chips, these are only one example of circuit components consuming relatively high power and developing significant heat. Amongst many other circuits that may benefit from the present invention are microprocessor chips, as used inter alia in computers and in a growing number of appliances.

The present Applicant has proposed a method of printing which requires polymeric particles on a donor surface to be heated to the point where they become tacky. When the donor surface is subsequently pressed against a substrate, the particles transfer to the substrate to form the desired printed image. The polymeric particles to be rendered tacky are heated by laser beams that are emitted by an array of VCSEL chips. The particles may contain a colouring agent (e.g., a pigment or a die), in which case the printed image is coloured at least in part, or they may be devoid of such agents, in which case the printed image may provide a different effect on the printing substrate (e.g., gloss, embossing, etc.) or serve as a receptive layer for a subsequent printing step.

Considerable power is required to generate the amount of energy needed to soften the polymer particles. To avoid overheating of the chips, they have hitherto been directly mounted on a thin rigid ceramic circuit board in direct thermal contact with a cooled manifold. The ceramic circuit board is a good thermal conductor but is also a good electrical insulator. This allows electrical traces, sometimes also termed tracks or leads, to be formed electrolytically directly on the ceramic circuit board, with contact pads onto which the VCSEL chips could be soldered.

At a separate location, offset from the VCSEL chips, the ceramic circuit board is formed with further contact pads to allow soldering of a flexible circuit board having traces for connecting the VCSEL chips to control and driver circuits. Thus, current from the control and driver circuits needs to flow through a trace on the flexible circuit board, a first soldered connection between the flexible and ceramic circuit boards, a corresponding trace on the ceramic circuit board and a second soldered connection between the ceramic circuit board and the VCSEL chip, before arriving at the relevant VCSEL element.

Such a method of mounting and cooling of the VCSEL chips had certain disadvantages that affect reliability. First, the fact that there are two soldered connections in the current path leading to every contact of the VCSEL chip increases the possibility of a poor electrical connection. Defects in the soldered connections, which may increase or propagate with time, may even cause a failure during operation of the chip. Second, the ceramic board is itself relatively fragile and has been known to crack. Making it more robust (e.g., thicker) detracts from its thermal efficiency, while cracking of the board would cause open circuits in the traces formed on the board, which may additionally detract from the integrity of the circuitry of the chip.

US2006/0109632 (Berlin et al.) discloses circuit subassembly comprising a rigid substrate formed of an electrically insulating but thermally conductive material, a circuit board mounted on the substrate, the circuit board having a base and a plurality of traces terminating in respective contact pads, a circuit component mounted on an opposite side of the circuit board from the rigid substrate and electrically connected to the contact pads of the circuit board, and holes formed in the circuit board that are filled with electrically and thermally conductive vias to conduct heat from the circuit component to the rigid substrate and to connect traces on the circuit board to the circuit component. In US2006/0109632, the circuit board has a base formed of a laminate construction of ceramic layers and the thermally conductive vias are formed by filling holes formed in the base with a silver paste which is subsequently fired. The firing, performed at elevated temperatures of 700° C. or more, is critical not only for the formation of the conductive path in the vias, but also for the formation of the multi-layered ceramic support.

In certain applications, it is desirable for the circuit board to be flexible yet the circuit board of US2006/0109632 is necessarily rigid as it is made of a ceramic. The same method of production cannot be employed with flexible circuit board where the base is made of a material than cannot withstand the high temperature needed to sinter the ceramic layers and the silver paste in order to form the vias. Furthermore, the base of a flexible board may have a thickness of only a few tens of microns, and preferably even less, which would make it very difficult to form sintered vias, even if the material of the base could withstand the temperature.

OBJECT

The present invention seeks therefore to provide inter alia a method of mounting and cooling a circuit component having a plurality of contacts on a rigid substrate made of an electrically insulating material that is thermally conductive using a thin flexible circuit board.

SUMMARY

In accordance with a first aspect of the invention, there is provided a method of mounting and cooling a circuit component having a plurality of contacts, which method comprises:
(i) providing a rigid substrate of a thermally conductive and electrically insulating material, (ii) providing a circuit board having an electrically insulating flexible base and electrically conductive traces on the flexible base for connection to the contacts of the circuit component, each trace terminating in a respective contact pad positioned to align with a respective contact of the circuit component, (iii) securing the circuit board to the rigid substrate with at least some of the contact pads on the circuit board disposed on the side of the circuit board facing the rigid substrate, (iv) bonding at least some of the contact pads on the side of the circuit board facing the rigid substrate to the rigid substrate, to establish thermal contact between the bonded contact pads and the rigid substrate, (v) forming blind holes in the flexible base of the circuit board, each hole terminating at a respective one of the contact pads on the flexible base that is on the side of the circuit board facing the rigid substrate, (vi) plating the side of the contact pads exposed by the holes to grow at least one metallic material to fill the holes in the flexible base of the circuit board and thereby form electrically and thermally conductive vias extending between opposite sides of the flexible base, (vii) placing the circuit component on the circuit board, such that the circuit board having the flexible base lies between the circuit component and the rigid substrate, and (viii) soldering the contacts of the circuit component to the vias to establish an electrical connection between the contacts of the circuit component and the traces on the circuit board and a thermal connection between at least some of the contacts of the circuit component and the rigid substrate.

The pads of the circuit board may be connected directly to the rigid substrate, or to metallic pads formed on the rigid substrate by diffusion bonding or low temperature sintering.

The term "diffusion bonding" refers to a method of establishing a connection between a metal and another material (which may but need not itself be a metal) in which heat and pressure are applied to the metal, so that the contacting surfaces are bonded to each other by diffusion or migration, without the metal reaching its melting point.

The term "low temperature sintering" is used in this context to refer to a method of establishing a connection between a metal and another material (e.g., a ceramic material as used for a rigid substrate) in which heat and pressure are applied to the two materials, so that they are bonded to each other, without the metal reaching its melting point. Typically, low temperature sintering is performed at a temperature of 300° C. or less.

Diffusion bonding and sintering differ from soldering and brazing in that they do not employ any liquid filler and, depending on the materials and bonding conditions, may not necessarily require the use of a bonding agent. Avoiding the use of a liquid filler in a method of manufacturing sub-assemblies according to the present teachings is desirable as it prevents accidental short circuiting when the contact pads are located close to one another.

Conveniently, the plating forming the vias may be electroless nickel immersion gold (ENIG) plating.

According to a second aspect of the invention, there is provided a circuit sub-assembly comprising:

a) a rigid substrate formed of an electrically insulating but thermally conductive material, b) a circuit board mounted on the substrate, the circuit board having a base and a plurality of traces terminating in respective contact pads, c) a circuit component mounted on an opposite side of the circuit board from the rigid substrate and electrically connected to the contact pads of the circuit board, and d) holes formed in the circuit board that are filled with electrically and thermally conductive vias to conduct heat from the circuit component to the rigid substrate and to connect traces on the circuit board to the circuit component, characterized in that e) the base of the circuit board is flexible, f) at least some of the contact pads of the circuit board are arranged on the side of the circuit board facing the rigid substrate and are bonded to the rigid substrate, g) at least some of the holes in the flexible base of the circuit board terminate at, but do not pass through, respective contact pads bonded to the rigid substrate, and h) each via filling a hole in the flexible base of the circuit board is formed as a plating of the side of the respective contact pad facing away from the rigid substrate that is soldered to a respective contact of the circuit component.

In some embodiments, the flexible base of the circuit board may have a thickness in the range of 1 μm to 125 μm, 2 μm to 75 μm, 2 μm to 50 μm, 2 μm to 25 μm, 2 μm to 10 μm, or 2 μm to 5 μm.

As the afore-mentioned circuit sub-assembly includes at least one flexible part and at least one rigid part connected to one another, the sub-assembly may also be referred to as a "rigid-flex sub-assembly", a "rigid-flex assembly", or a "rigid-flex circuit", and like variants.

Though US2006/0109632 discloses the manufacture of a circuit sub-assembly comprising a circuit component having a plurality of contacts, a circuit board having plurality of traces on the base to which the contacts of the circuit component are electrically connected, and a rigid substrate, formed of electrically insulating but thermally conductive material, disposed on the opposite side of the flexible circuit board from the circuit component, it is believed that the use of a circuit board having a flexible base in such a configuration has never previously been attempted. This is because the flexibility of the base of the circuit board creates several challenging obstacles, in particular when considering relatively thin flexible bases having a thickness of less than 100 micrometres (μm).

One of the serious obstacles encountered when using a circuit board having a flexible base is that the base is made of a plastics material that cannot withstand the high temperatures required for metal sintering.

The invention differs from US2006/0109632 inter alia in the method by which the vias are formed. Whereas the holes in the '632 application are through holes, those in the base of the circuit board of the invention are blind holes that are closed off at one end by means of a contact pad that is bonded, or to be bonded, to the rigid substrate. Because the vias in the case of the present invention are only required to have a height of only a few microns, they can be formed by plating the metallic surface covering and closing off the ends of holes in the base. This avoids the need for the vias to be formed by sintering and also obviates the need for a solder connection between the vias and the traces on the circuit board. As a result, only a single solder joint is required in the electrical path, namely that between the vias and the respective contacts of the circuit component.

These and additional benefits and features of the disclosure will be better understood, and in part will be readily apparent to those skilled in the art, with reference to the following detailed description taken in conjunction with the figures, the non-limiting examples and the appended claims.

BRIEF DESCRIPTION OF THE DRAWINGS

The invention will now be described further, by way of example, with reference to the accompanying drawings, where like reference numerals or characters indicate corresponding or like components. The description, together with the figures, makes apparent to a person having ordinary skill in the art how some embodiments of the invention may be practiced. The figures are for the purpose of illustrative discussion and no attempt is made to show structural details of an embodiment in more detail than is necessary for a fundamental understanding of the invention. For the sake of clarity and convenience of presentation, some objects depicted in the figures are not necessarily shown to scale.

In the figures.

DETAILED DESCRIPTION

Figure 1:
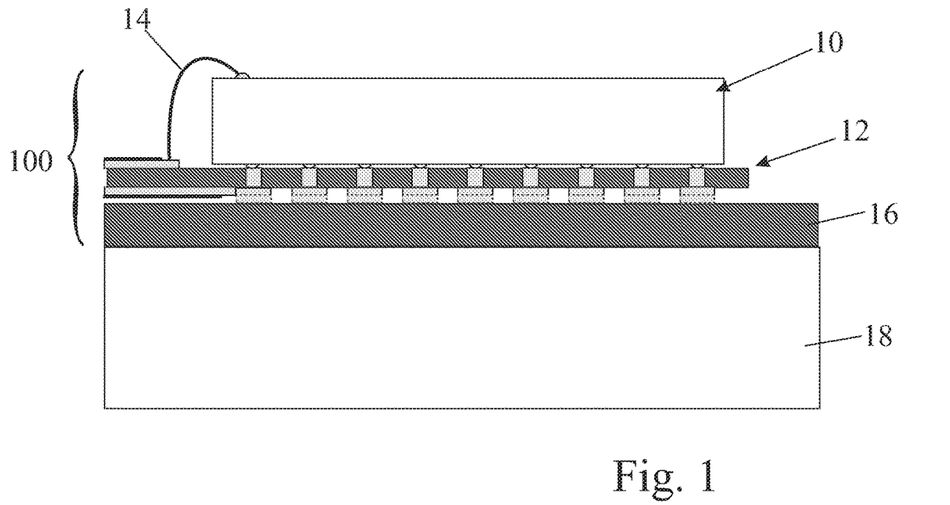
FIG. 1 is a section through a sub-assembly comprising a VCSEL die, a flexible circuit board, a rigid substrate and a heat sink.

FIG. 1 shows a section through a circuit sub-assembly 100 having a circuit component in the form of a die 10, mounted on a rigid substrate 16 that is cooled by means of a heat sink 18, there being a flexible circuit board 12 disposed between the die 10 and the rigid substrate 16. The interconnections between these components are described below by reference to FIG. 2, which is an exploded view of the sub-assembly. In all the figures, to assist understanding, the die 10 and the heat sink 18 have been left unshaded, darker grey shading has been used for electrically insulating materials and lighter grey for electrical conductors. The figures being cross sections through an exemplary circuit sub-assembly, zooming in on an illustrative section of a sub-assembly, it is clarified that additional traces are typically present, these being hidden from the illustrated views in which a trace may be concealed by a contact pad terminating it. Drivers and controls are not shown.

A circuit board, whether flexible or rigid, may also be referred to herein as a printed circuit board, regardless of the actual mode of formation of the pattern of the electrically conductive circuit on a flexible or rigid support. As readily appreciated by persons skilled in the art of printed circuit boards, a circuit can be formed by additive methods (e.g., selective deposition of a desired pattern of conductors) or subtractive methods (e.g., etching away the areas surrounding a desired pattern from a uniform conductive layer), and need not necessarily be "printed" in the conventional sense of the term. These methods need not be detailed herein.

Figure 2:
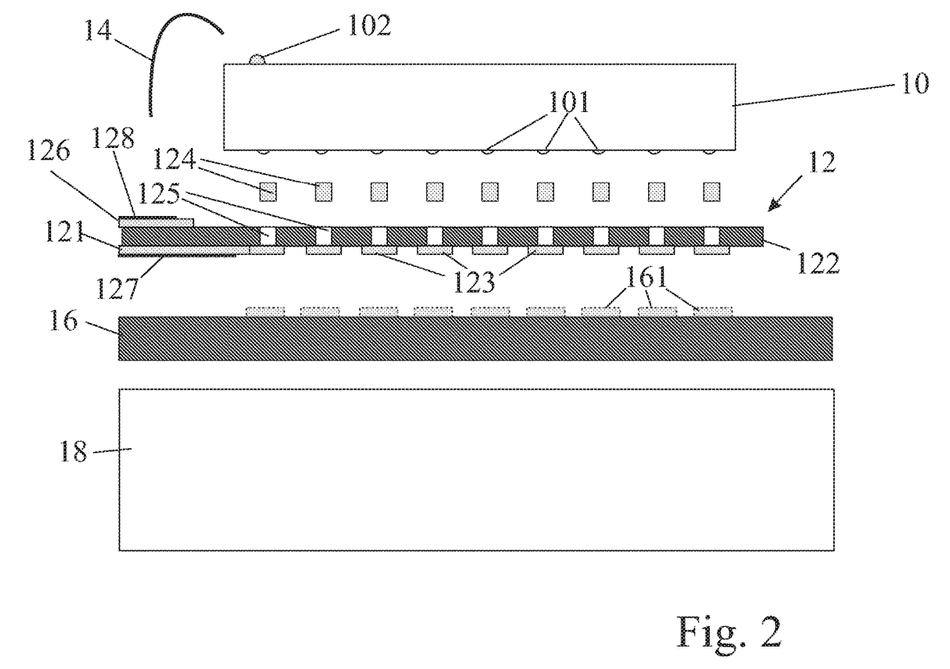
FIG. 2 is an exploded view of the sub-assembly shown in FIG. 1.

Referring now to FIG. 2, the die 10 has multiple contacts 101 on its underside, as viewed, and a single contact 102 on its upper side. While represented in the figure by a single contact 102 on the upper side of the die, the number of common contacts can be of more than one, while being preferably of less than the number of the multiple contacts 101 on the underside of the die. The number of common contacts is preferably a half or less, a third or less, a quarter or less than the number of the multiple contacts.

The contacts, which can be applied by the die manufacturer, can have the form of bumps of indium (In), gold (Au), silver (Ag), tin (Sn), or alloys thereof, or be SAC solder bumps, SAC alloys comprising various amounts of tin (e.g., ≥95%), silver (e.g., ≤5%) and copper (e.g., ≤1%), the solder bumps intended to enable surface mounting of the die. The die 10 may, for example be a VCSEL chip. Such a chip comprises a number of laser elements (e.g., 16, 32, 64, 128, 256, etc.) each of which can be powered by applying a voltage across a respective one of the contacts 101 and the one or more common contacts 102. For example, where the die 10 is a VCSEL chip having sixty-four individual laser elements, the die may include sixty-four contacts 101 and eight common contacts 102. As mentioned, a VCSEL chip is only one example of a die component that may benefit from the present invention, and were the die be instead a CPU, such units may contain a few hundreds and up to a few thousands individual contacts, generally tightly packed.

Reverting to the VCSEL example, when a laser beam is emitted from an individual laser element of a VCSEL chip, much heat is produced in the vicinity of the active laser element. For this reason, it is desirable that, as well as providing a path for electricity to flow to the laser element, the electrical conductor leading to the respective contact 101 of the die should provide a thermal path to allow heat to be dissipated from the die 10. In view of the high number of connections that such a die may require, not all electrical conductors need necessarily have the dual role of serving as thermal path for heat dissipation. In some embodiments, it suffices for only some of the connections between the various parts of the sub-assembly to reject excessive heat (e.g., via contact of the rigid board to a heat sink).

It will be appreciated that a VCSEL chip is only one type of die that has multiple contacts to be connected by electrical conductors to other circuitry and that needs to be cooled during operation on account of the heat generated and that the improvement provided by the present invention is equally applicable to such other dies. Moreover, while the present invention is advantageous for applications in which the heat that is generated by the die, elements thereon and/or the current needed thereby can be substantial (e.g., raising the temperature by 20° C. or more above ambient operating temperature), it may alternatively or additionally serve rigid-flex assemblies in which the number of contacts is elevated (e.g., >50 contacts/mm$^2$) and/or in which the pitch between adjacent contacts is relatively small (e.g., ≤200 μm, or ≤100 μm, or ≤75 μm, the pitch typically not being less than 50 μm). A similar relatively small pitch can be formed between corresponding adjacent holes (small, e.g., ≤200 μm, or ≤100 μm, or ≤75 μm, and optionally ≥50 μm).

The electrical conductors leading to the individual contacts 101 are formed by conductive traces 121 of the flexible circuit board 12 which has a flexible base 122. Each trace terminates in a pad 123 aligned with a respective contact 101 of the die 10 and connected to it by a metal 124 filling a hole 125 in the base 122 of the flexible circuit board 12. Holes can be drilled in the flexible circuit board by a CNC machine, a UV laser, or a CO$_2$ laser, by chemical etching of the material of the base of the circuit board, by reactive ion etching (a synergistic process between chemically active species and energetic ion bombardment known by the acronym IRE) or using any suitable device or method to form holes having a diameter (or any other representative dimension) in the range of 40 μm to 200 μm, or of 40 μm to 100 μm, or of 40 μm to 75 μm. The drilling method must be sufficiently selective to form holes only through the thickness of the flexible base, without damaging the underlying contact pads (e.g., 123) or any trace pre-existing on the flexible base overlapping the position of an intended hole. If desired, the holes may in some embodiments be formed in the flexible base of the circuit board after it has been secured to the rigid substrate.

The flexible circuit board 12 also has, on its opposite side, a common or ground conductor 126, connected to the one or more common contacts 102 on the die 10 by means of a respective ribbon or wire 14, typically made of gold (Au), aluminium (Al), or copper (Cu). Insulating layers 127 and 128 of solder mask overlie the conductive traces 121 and the common conductor 126, to avoid undesired chemical alteration of the conductive material (e.g., oxidation of metals) and short circuiting (i.e. an inadvertent electrical connection between traces allowing a current to travel along an unintended path).

To cool the die 10, a thin rigid substrate 16 of thermally conductive, but electrically insulating, material is provided that can be mounted in good thermal contact with a heat sink 18, which may for example be fluid cooled. Contact pads 161 are optionally formed on the rigid substrate 16 which can be bonded in the assembled state to the pads 123 on the flexible circuit board 12 (e.g., by diffusion fusing). Alternatively, contact pads 123 can be directly low temperature sintered or diffusion bonded to the rigid substrate 16. Direct low temperature sintering (e.g., between 150° C. and 300° C. or between 200° C. and 300° C.) can be facilitated by the use of silver for the formation of contact pads 123 and by the surface of the rigid substrate being relatively rough (e.g., having an average surface roughness $r_z$ in the range of 1 µm to 10 µm, 1 µm to 5 µm, or 1 µm to 2 µm). Heat generated at each contact 101 can flow to the heat sink 18 via the thermally conductive path formed by the metal 124, the contact pads 123 (and 161, when present) and the rigid substrate 16. As earlier mentioned, it is not essential for all interconnections to serve as thermal paths.

While for simplicity of illustration the metal filling holes 125 is illustrated as a single block possibly of a same material, metal 124 may include two or more layers of distinct metals or alloys thereof. For illustration, in one embodiment, the holes can be filled by a first layer of nickel, the nickel layer facing the pads 123 and by a second layer of gold, the gold layer facing the contacts 101 on die 10. In another embodiment, the holes can be filled by three layers of metal such as a first layer of nickel, the nickel layer facing the pads, a second intermediate layer of platinum or palladium and by a third layer of gold, the gold layer facing the contacts. The filling of the holes with conductive materials can be done using electroless plating and/or electrochemical plating of metals. It can additionally or alternatively be done in consecutive steps to form layers of various metals and/or alloys, e.g., gold, nickel, palladium, platinum and more. By sandwiching the flexible printed circuit board 12 between the die 10 and the rigid substrate 16 on the heat sink 18, the illustrated sub-assembly provides an electrical path to each contact 101 of the die that may additionally provide a thermal path to the heat sink 18.

A method of constructing the sub-assembly of FIGS. 1 and 2 and further details of the parts of the sub-assembly will now the described by reference to FIG. 3, in which nine stages are schematically represented, and designated by Roman numerals I to IX, respectively.

The manufacture of the sub-assembly may commence with a blank flexible board 120 (e.g., a copper clad laminate having one or more (e.g., two) layers of copper) and a rigid thermally conductive but electrically insulating substrate 16, these being commercially available items. In some embodiments, the flexible printed circuit board 12 described with reference to FIGS. 1 and 2 can be prepared according to some of the following steps. Hence, materials and parameters described below in the context of the process and of a blank and step-wisely modified flexible board 120 may accordingly apply to a finished circuit board 12 including traces in any desired pattern constituting the circuit.

In stage I, the flexible board 120 comprises only the flexible base 122 and the common conductor 126 which is laminated onto the base 122. As the base 122 can be flimsy, a firmer carrier 129 can be secured to the opposite side of the common conductor 126.

The flexible base 122 of the circuit board 120 may be formed of thermoplastic or thermosetting plastic materials, such as polyimide (PI), polyether ether ketone (PEEK), polyester (including polyethylene terephthalate (PET)), polyethylene naphthalate (PEN), polyetherimide (PEI), any suitable fluoropolymer (FEP) or any suitable copolymer. The flexible base typically has a thickness in the range of 1 µm to 125 µm, or 2 µm to 75 µm, or 2 µm to 50 µm, or 2 µm to 25 µm, or 2 µm to 10 µm, or 2 µm to 5 µm, but thicker flexible base thicknesses are possible, as long as the resulting flexible board 12 can be sufficiently bended to fit its purpose.

The conductor 126, as well as the traces 121 are typically formed of copper or a copper alloy, but could be made of any suitable electrically conductive material (e.g., a metal, such as silver, gold, aluminium, or nickel, or a conductive polymer, such as polypyrrole, etc.). The thickness of a conductor layer 126 is generally within the range of 1 µm to 100 µm, or of 1 µm to 50 µm, or of 5 µm to 20 µm.

The conductor layer 126 is typically laminated with the flexible base 122 in presence of an intermediate adhesive layer adapted to the polymer and the conductive material to be attached. Some laminates 120 may not require an adhesive to achieve structural integrity.

The material of the carrier 129, if itself flexible, is typically polyethylene terephthalate (PET), but this is unimportant, as the carrier is later to be separated and discarded. Alternatively, the carrier can be a solid support, such as a glass backing or a silicon wafer, in which case it can be recycled following separation of the laminate.

The rigid thermally conductive substrate 16 may be made of aluminium nitride (AlN), which has a thermal conductivity in the range of about 100 to about 250 watts per meter-Kelvin (W/m·K), or in the range of about 100 to about 230 W/m·K, or in the range of about 140 to about 250 W/m·K, or in the range of about 140 to about 230 W/m·K, or in the range of about 170 to about 250 W/m·K, or in the range of about 170 to about 230 W/m·K, as measured at ambient temperature and pressure. The rigid substrate may have a thickness of about 250 µm or less, 200 µm or less, 150 µm or less, 100 µm or less, and even of about 50 µm or less. The thickness of a rigid substrate suitable for the present invention is generally of 5 µm or more, 10 µm or more, or 25 µm or more. Such a relatively thin thickness is noteworthy, as conventional rigid-flex, in which a ceramic rigid substrate would typically include part of the circuitry and points of connection presently restrained to the flexible segment(s) of sub-assemblies according to the present teachings, would typically have a thickness of 300 µm or more, or even 350 µm or more, if made of a similar material.

Any alternative material that is sufficiently robust and capable of withstanding the operating temperature of the circuit sub-assembly and its components may be employed as a rigid substrate. For example, many ceramic materials such as boron nitride (BN), boron phosphide (BP), Shapal™

Hi-M Soft (a machinable hybrid type of aluminium nitride and boron nitride developed by Tokuyama Corporation), beryllium oxide (BeO) and alumina ($Al_2O_3$), would be suitable. Alternatively, the rigid substrate may be made of diamond or diamond like carbon (DLC). Advantageously, the rigid substrate should have a coefficient of thermal expansion which matches the surfaces it may contact (e.g., the heat sink 18) in the temperature range of interest to the operating conditions of the sub-assembly (e.g., from −20° C. to +300° C.).

In stage II, the conductive traces 121 and contact pads 123 are formed on the base 122 of the flexible circuit board 120 and corresponding contact pads 161 are formed on the rigid substrate 16. These conductive traces and pads can be formed using conventional techniques employed in the manufacture of circuit boards and need not therefore be described herein in any detail. For example, the desired conductive pattern may be applied by electroplating and a thickness of copper or copper alloy built up on the pattern by electroplating to achieve the desired level of conductivity. Suitably the traces may have a width between 5 μm and 100 μm, between 5 μm and 50 μm, or between 5 μm and 25 μm. Typically, the minimal distance (space) between adjacent traces is between 5 μm and 500 μm, between 5 μm and 250 μm, between 5 μm and 125 μm, or between 5 μm and 62.5 μm. The minimal distance between adjacent lines can also be referred to as the Critical Dimension (CD) space of a circuit. It is clarified that printed circuits may also include regions in which the adjacent lines are separated from one another by more than 500 μm, and can be for example distant by a few millimetres, or even a few centimetres, depending on the circuit board design. While traces may have a variety of shapes and cross-sections profiles, traces having a trapezoidal or rectangular cross-section are preferred. The aspect ratio of trace profile, between the width of the trace at the level of its base on the surface of the flexible board and its maximal height (typically, but not necessarily in the centre of the width of the trace) is in the range of 1:5 to 2:1, or between 1:4 to 2:1, or between 1:3 to 2:1.

The metals used to form the pads 123 and 161 are selected such that they can be diffusion bonded to one another to form a physically strong connection and provide good thermal and electrical conductivity between the pads 123 and 161. Contact pads are generally, from a top view, circular or ellipsoidal, with at least one diameter typically greater than the width of the traces the pads are terminating. Preferably the diameter of contact pads on the printed circuit corresponds to 80% to 120% of the diameter of the contacts on the die. The height of the contacts pads on the printed circuits is generally similar to the height of the traces, but can be higher by up to 10%, up to 20%, or up to 40% of the height of the traces the pads are terminating in view of inter-connectivity.

In stage III, the flexible circuit board 120 (including any traces 121 and pads 123 thereon) and the substrate 16 are heated while pressure is applied to achieve the desired bond (e.g., by diffusion bonding or low temperature sintering), without any of the materials involved transitioning into a liquid-phase. While the temperature and the pressure may depend on the particular configuration (e.g., materials and dimensions) of each of the flexible circuit board 120, the substrate 16, and the contact pads 123 (and 161, when present) formed thereon, the temperature and pressure being applied are each and in combination sufficiently high to achieve bonding and sufficiently low to prevent functional impairment and/or reduce physical damage of the assembly or parts thereof. A suitable temperature can be in the range of 100° C. to 300° C., 150° C. to 300° C. or 200° C. to 300° C. Generally, the temperature used in the present method are relatively lower than temperatures conventionally used in the preparation of articles entirely based on heat resistant materials. As can be appreciated, the presence of a thin flexible base made of plastics materials (also referred to as polymers) precludes the use of temperatures adapted to generally thicker supports made of ceramics, and in particular the use of elevated temperatures (e.g., of above 700° C.) suitable for sintering of electrically conductive materials and/or for the bonding of rigid layers of laminated supports.

A suitable pressure can be in the range of 0.5 megapascal (MPa) to 100 MPa, 0.5 MPa to 60 MPa, or 1 MPa to 10 MPa. A desired diffusion bonding temperature can be obtained by concomitant or sequential ramp-up of each of these factors, for instance pressure may be raised to required level, after the desired temperature is reached. Under suitable afore-said temperature and pressure, such bonding can be obtained within a few minutes (e.g., in 5 min or less, 4 min or less, 3 min or less, or 2 min or less) or at elevated temperature within the permissible range and pressure within a few seconds (e.g., in 60 sec or less, 40 sec or less, or 30 sec or less). Generally, a bonding duration is of at least 10 seconds.

In stage IV, a solder mask layer 127 is applied to the conductive traces 121 and in stage V a similar solder mask 128 is applied to parts of the common conductor 126 after the carrier 129 has been peeled off. The solder mask layers 127 and 128 are applied to cover any metal or otherwise conductive material that is not required for interconnection, making sure that any part covered thereby remains physically intact and that electricity only flows through intended paths, without shortcuts.

In stage VI, one or more sections of the common conductor 126 not selectively protected by solder mask 128 are etched to expose the region of the base 122 of the flexible circuit board overlying the contact pads 123 (and 161, when present), this being the region on which the die 10 is later to be mounted.

In stage VII, holes 125 are formed in the base 122 of the flexible circuit board in alignment with the pads 123 (and 161, when present). The holes 125, which may for example be formed by drilling, by exposure to a laser, or by physical/chemical etching, are filled in stage VIII with metal 124 to form vias. The filling may be achieved, for example by using electroless nickel immersion gold (ENIG) plating or electrolytic silver deposition to form electrically and thermally conductive vias (vertical interconnect accesses). Metal 124, regardless of composition and method of deposition, may be referred to as Under Bump Metallization (UBM). Preferably, the metal filling the hole (optionally in more than one layer, such as in two layers or three layers, and so on) will be level with the surface of the flexible base. A UBM protruding above the level of the flexible base would unnecessarily increase the thermal path, whereas a UBM depressed with respect to the flexible base surface may cause Design Induced Voids in the soldering process, increasing the thermal resistance, both phenomena reducing the cooling efficacy as compared to a levelled UBM 124.

In stage IX, manufacture of the sub-assembly is completed by soldering the contacts 101 of the die 10 to the UBM 124 filling the holes 125 and by bonding a wire 14 (e.g., made of gold) to the contact 102 and the common conductor 126. Such soldering and wire bonding are carried in the conventional way of soldering and bonding components to a surface mount circuit board.

Figure 3:
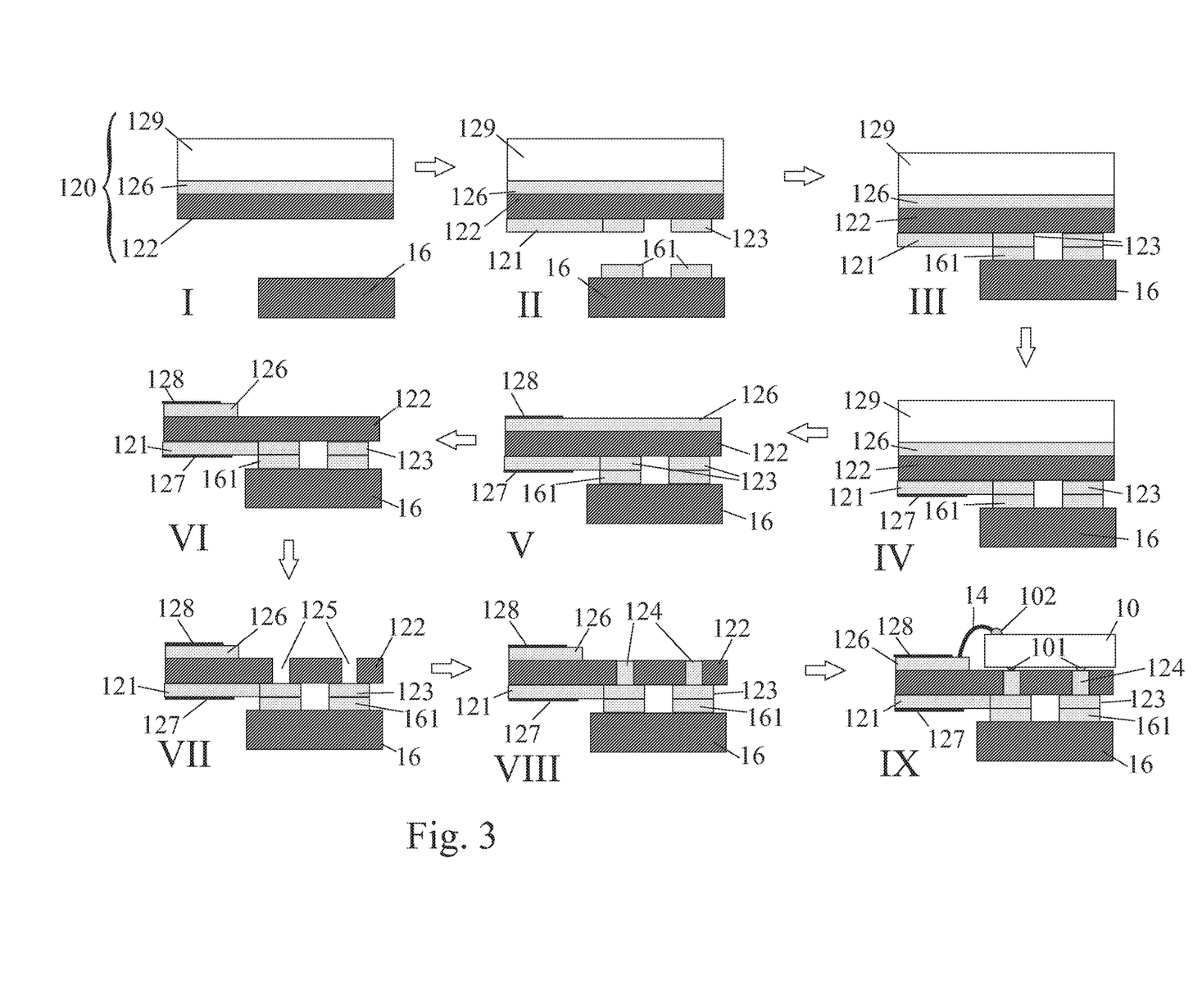
FIG. 3 shows schematically the steps involved in a method according to an embodiment of the present invention for the manufacture of the sub-assembly of FIGS. 1 and 2.

While for clarity flexible board 120 is illustrated in FIG. 3 as including a single layer of conductor 126, this need not be construed as limiting and the flexible board may include more than one such layer. In such a case, the different conductive layers, or conductors therein, can be connected to one another by any appropriate number of conventional vias.

Though the step of bonding the contact pads 123 to the rigid substrate 16 is shown in FIG. 3 as being the first step in the manufacturing process, it would be alternatively possible for the bonding to take place after holes 125 have been made in the base 122 of the circuit board and filled with metal 124.

It will be noted from the above that the rigid substrate 16 does not carry any traces that conduct current to the die 10 from its control and driver circuits (not shown in the figure). As a result, should the rigid substrate include or develop a crack, it would not interfere with operation of the die. For illustration, while a rigid substrate that carries traces may have an overall thickness of at least about 250 μm, in the present invention a trace free rigid substrate may have a thickness of at most 200 μm, at most 150 μm, at most 100 μm, or at most 50 μm; the thickness of the rigid substrate being at least 5 μm, at least 10 μm, or at least 25 μm. This in turn improves heat flow through the rigid substrate to the heat sink, facilitating the dissipation of heat that may be generated by the die.

It will be appreciated that various modifications can be made to the embodiment described with reference to FIG. 3, while remaining within the scope of the present invention as set forth in the appended claims. For example, it has been assumed in the described embodiment that all the contact pads 123 on the flexible circuit board 12 which are to be connected to the contacts 101 of the die 10 are formed on the side of the flexible base 122 facing away from the die 10 and towards the rigid substrate 16 and that all the connections providing an electrical path to the contacts 101 also serve to provide a thermal path to the rigid substrate. Neither of these is essential. For example, one may wish to form some of the pads 123 on one side of the flexible base 122 and others on the opposite side. The contact pads facing the die 10 in such a construction may be directly soldered to the contacts 101 so that they would not provide a thermal path to the heat sink 18 and only the pads 123 on the side of the flexible board facing away from the die 10 would provide a thermal path to the heat sink. Furthermore, thermal connections may be provided between the die 10 and the rigid substrate 16 that pass through holes in the base of the flexible printed circuit board but do not provide an electrical connection between a contact of the die and a trace of the flexible circuit board.

While, for the sake of illustration, this disclosure has been described in terms of certain embodiments and generally associated methods, alterations and permutations of the embodiments and methods will be apparent to those skilled in the art based upon Applicant's disclosure herein. The present disclosure is to be understood as not limited by the specific embodiments described herein. It is intended to embrace all such alternatives, modifications and variations and to be bound only by the spirit and scope of the disclosure and any change which come within their meaning and range of equivalency.

It is appreciated that certain features of the disclosure, which are, for clarity, described in the context of separate embodiments, may also be provided in combination in a single embodiment. Conversely, various features of the disclosure, which are, for brevity, described in the context of a single embodiment, may also be provided separately or in any suitable sub-combination or as suitable in any other described embodiment of the disclosure. Certain features described in the context of various embodiments are not to be considered essential features of those embodiments, unless the embodiment is inoperative without those elements.

Unless otherwise stated, the use of the expression "and/or" between the last two members of a list of options for selection indicates that a selection of one or more of the listed options is appropriate and may be made.

The word "exemplary" is used herein to mean "serving as an example, instance or illustration". Any embodiment described as "exemplary" is not necessarily to be construed as preferred or advantageous over other embodiments and/or to exclude the incorporation of features from other embodiments.

In the disclosure, unless otherwise stated, adjectives such as "substantially", "approximately" and "about" that modify a condition or relationship characteristic of a feature or features of an embodiment of the present technology, are to be understood to mean that the condition or characteristic is defined to within tolerances that are acceptable for operation of the embodiment for an application for which it is intended, or within variations expected from the measurement being performed and/or from the measuring instrument being used. When the terms "about" and "approximately" precede a numerical value, it is intended to indicate +/−15%, or +/−10%, or even only +/−5%, and in some instances the precise value. Furthermore, unless otherwise stated, the terms (e.g., numbers) used in this disclosure, even without such adjectives, should be construed as having tolerances which may depart from the precise meaning of the relevant term but would enable the invention or the relevant portion thereof to operate and function as described, and as understood by a person skilled in the art.

In the description and claims of the present disclosure, each of the verbs "comprise", "include" and "have", and conjugates thereof, are used to indicate that the object or objects of the verb are not necessarily a complete listing of features, members, steps, components, elements or parts of the subject or subjects of the verb.

As used herein, the singular form "a", "an" and "the" include plural references and mean "at least one" or "one or more" unless the context clearly dictates otherwise. At least one of A and B is intended to mean either A or B, and may mean, in some embodiments, A and B.

Positional or motional terms such as "upper", "lower", "right", "left", "bottom", "below", "lowered", "low", "top", "above", "elevated", "high", "vertical", "horizontal", "backward", "forward", "upstream" and "downstream", as well as grammatical variations thereof, may be used herein for exemplary purposes only, to illustrate the relative positioning, placement or displacement of certain components, to indicate a first and a second component in present illustrations or to do both. Such terms do not necessarily indicate that, for example, a "bottom" component is below a "top" component, as such directions, components or both may be flipped, rotated, moved in space, placed in a diagonal orientation or position, placed horizontally or vertically, or similarly modified.

Unless otherwise stated, when the outer bounds of a range with respect to a feature of an embodiment of the present technology are noted in the disclosure, it should be understood that in the embodiment, the possible values of the feature may include the noted outer bounds as well as values in between the noted outer bounds.

Certain marks referenced herein may be common law or registered trademarks of third parties. Use of these marks is by way of example and shall not be construed as descriptive or limit the scope of this disclosure to material associated only with such marks.

The invention claimed is:

1. A method of mounting and cooling a circuit component having a plurality of contacts, which method comprises:
   (i) providing a rigid substrate of a thermally conductive material, the substrate having a face with at least one electrically isolating region thereupon;
   (ii) providing a circuit board having an electrically insulating base and two opposing sides, a plurality of electrically conductive traces on or in the base, each trace terminating in a respective contact pad positioned to align with a respective contact of the plurality of contacts of the circuit component;
   (iii) forming a plurality of blind holes in the base of the circuit board, each hole terminating at a respective one of the contact pads on the base that is on the side of the circuit board facing the rigid substrate;
   (iv) filling the blind holes in the base of the circuit board with at least one metallic material, and thereby forming electrically and thermally conductive vias extending between the opposite sides of the base;
   (v) securing the circuit board to the rigid substrate with at least some of the contact pads on the circuit board disposed on the side of the circuit board facing the electrically insulating region of the rigid substrate;
   (vi) bonding at least some of the contact pads on the side of the circuit board facing the rigid substrate to the electrically insulating region of the rigid substrate, so as to establish thermal contact between the bonded contact pads and the rigid substrate;
   (vii) placing the circuit component on the circuit board, such that at least the circuit board base lies between the circuit component and the rigid substrate; and
   (viii) soldering the contacts of the circuit component to the respective vias.

2. A method as claimed in claim 1, wherein the filling of the blind holes serves to establish an electrical connection between the contacts of the circuit component and the traces on the circuit board, and a thermal connection between at least some of the contacts of the circuit component and the rigid substrate via the electrically insulating region thereof.

3. A method as claimed in claim 1, wherein the filling of the blind holes comprises plating the side of the contact pads exposed by the holes with the at least one metallic material, the plating being sufficient to substantially fill the respective hole.

4. A method as claimed in claim 1, wherein the circuit board base is flexible.

5. A method as claimed in claim 1, wherein the circuit board base is rigid.

6. A method as claimed in claim 1, wherein the contact pads of the circuit board are bonded directly to the electrically insulating region of the rigid substrate by diffusion bonding, low temperature sintering, or soldering.

7. A method as claimed in claim 1, wherein the contact pads on the side of the circuit board facing the rigid substrate are bonded to the rigid substrate by forming metallic substrate contact pads on the rigid substrate, or on the electrically insulating region thereof, to align with the contact pads on the circuit board, and bonding the aligned contact pads on the circuit board and the substrate contact pads to one another.

8. A method as claimed in claim 7, wherein the contact pads of the circuit board are bonded to the substrate contact pads by diffusion bonding, low temperature sintering, or soldering.

9. A method as claimed in claim 1, wherein the step of filling the holes is at least partially performed utilizing electroless nickel immersion gold (ENIG) plating.

10. A method as claimed in claim 1, wherein the base of the circuit board has a thickness in the range of 1 µm to 125 µm.

11. A method as claimed in claim 1, wherein the vias extending between the opposite sides of the base are formed of two layers or more.

12. A method as claimed in claim 1, wherein the rigid substrate has a thickness in the range of 5 µm to 250 µm.

13. A method as claimed in claim 1, wherein the rigid substrate is devoid of conductive traces.

14. A method as claimed in claim 4, wherein the flexible base of the circuit board is made of one or more plastics materials.

* * * * *